(12) United States Patent
Lopez

(10) Patent No.: US 11,984,373 B2
(45) Date of Patent: May 14, 2024

(54) PACKAGE FOR INTEGRATED CIRCUIT AND MANUFACTURING METHOD

(71) Applicant: STMicroelectronics (Grenoble 2) SAS, Grenoble (FR)

(72) Inventor: Jerome Lopez, Saint Jean de Moirans (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 158 days.

(21) Appl. No.: 17/522,327

(22) Filed: Nov. 9, 2021

(65) Prior Publication Data

US 2022/0157679 A1    May 19, 2022

(30) Foreign Application Priority Data

Nov. 16, 2020  (FR) ...................................... 2011727

(51) Int. Cl.
*H01L 23/31*       (2006.01)
*H01L 23/10*       (2006.01)
*H01L 23/12*       (2006.01)
*H01L 33/52*       (2010.01)
*H01S 5/02218*    (2021.01)
*H01S 5/068*       (2006.01)

(52) U.S. Cl.
CPC .......... *H01L 23/3114* (2013.01); *H01L 23/10* (2013.01); *H01L 23/12* (2013.01); *H01L 33/52* (2013.01)

(58) Field of Classification Search
CPC ..... H01L 23/3114; H01L 23/12; H01L 33/52; H01L 23/04; H01L 23/10; H01L 23/522; H01L 23/31; H01L 23/498; H01L 2224/71–72
See application file for complete search history.

(56) References Cited

U.S. PATENT DOCUMENTS

2009/0303087 A1*  12/2009  Chang ................ H01H 13/7006
                                                              341/22
2015/0292724 A1*  10/2015  Griffoni .................. F21V 23/06
                                                              362/326
2017/0194721 A1*   7/2017  Fan ......................... H01R 12/57
2019/0376676 A1   12/2019  Hannan et al.

FOREIGN PATENT DOCUMENTS

WO    2019223451 A1    11/2019
WO    2020177710 A1     9/2020

OTHER PUBLICATIONS

INPI Search Report and Written Opinion for FR Appl. No. 2011727 (which is the FR priority filing for the instant US filing), dated Jul. 21, 2021 (10 pages).

* cited by examiner

Primary Examiner — Walter H Swanson
Assistant Examiner — Jacob T Nelson
(74) *Attorney, Agent, or Firm* — Crowe & Dunlevy LLC

(57) ABSTRACT

An encapsulation hood is fastened onto electrically conductive zones of a support substrate using springs. Each spring has a region in contact with an electrically conductive path contained in the encapsulation hood and another region in contact with a corresponding one of the electrically conductive zones. The fastening of the part of the encapsulation hood onto the support substrate compresses the springs and further utilizes a bead of insulating glue located between the compressed springs.

13 Claims, 3 Drawing Sheets

PACKAGE FOR INTEGRATED CIRCUIT AND MANUFACTURING METHOD

PRIORITY CLAIM

This application claims the priority benefit of French Application for Patent No. 2011727, filed on Nov. 16, 2020, the content of which is hereby incorporated by reference in its entirety to the maximum extent allowable by law.

TECHNICAL FIELD

Embodiments and implementations relate to the packaging of integrated electronic devices, in particular the packages for integrated circuits, and, more particularly, the packages including an electrically connected encapsulation hood on a carrier substrate.

BACKGROUND

It is required for certain uses having an encapsulation hood to be able to detect whether the encapsulation hood is detached from the carrier substrate in such a way, if necessary, as to be able to interrupt the operation of the electronic chip contained in the package.

This is, for example, the case for a package incorporating a chip provided with a laser emitter and an encapsulation hood containing a lens. If the encapsulation hood is removed or broken, the chip must stop operating in such a way that the laser is not able to damage the eyes of the user.

An example of such a package of the prior art is schematically illustrated in FIG. 1.

More precisely, the package 1 includes a support substrate 2 including, on a mounting face, electrically conductive zones connected to a network of interconnections located in the body of the support substrate 2. The support substrate can be connected onto a printed circuit card by any suitable and conventional electric connection means, located on the face opposite to the mounting face.

In the context of BGA packages, these connection means can be a ball grid (not shown here).

The mounting face of the support substrate 2 supports at least one electronic chip, here an electronic chip 5 provided with a laser source 11.

An encapsulation hood 3 is fastened onto the mounting face of the support substrate 2 by fastening means and thus defines an inner housing 6 in which the electronic chip 5 is located.

The encapsulation hood 3 includes in this example an optical device, for example a lens 10, optically coupled to the laser source 11.

Here, the encapsulation hood 3 also incorporates an electrically conductive path 4 having a first end 30 and a second end 31.

Here, the means for fastening the encapsulation hood onto the support substrate include two spots of electrically conductive glue 80 and 81 respectively fastening the two ends 30 and 31 of the electrically conductive path 4 to two electrically conductive zones 70 and 71 located on the mounting face of the support substrate.

Moreover, between these two spots of electrically conductive glue there is a bead of insulating glue, not shown in this drawing.

In the case in which the encapsulation hood is not broken or separated from the support substrate, there is electric conduction between the electrically conductive zones 70 and 71 via the spots of conductive glue 80 and 81 and the electrically conductive path 4 incorporated into the encapsulation hood.

However, if the encapsulation hood is removed or broken, this electric conduction is broken, which allows to detect such an incident.

Alternatively, it is possible to replace the spots of conductive glue with solder pads.

However, these electrically conductive fastening regions (spots of glue or solder pads) are regions of accumulation of stresses coming mainly, but not only, from different expansion coefficients among the various components (encapsulation hood, support substrate, conductive fastening region and non-conductive adhesive materials in the zones not electrically conductive).

This can thus result in cracks and delamination in the package, schematically shown by the reference 9 in FIG. 1.

And, such defects can cause a malfunction.

There is therefore a need to provide a more satisfactory solution to the creation of packages for electrically connected integrated circuits.

SUMMARY

According to one embodiment and implementation, a new package structure is proposed that reduces, or even eliminates, the risk of appearance of defects such as cracks or delamination resulting from the fastening of the encapsulation hood onto the support substrate.

According to one aspect, a package for an integrated circuit is proposed, comprising a support substrate supporting at least one electronic chip and an encapsulation hood fastened onto the support substrate by a fastening device.

According to this aspect, the encapsulation hood incorporates an electrically conductive path having at least two distinct ends.

Moreover, the fastening device includes at least two springs, for example microsprings, respectively electrically coupling the two ends of the electrically conductive path to two corresponding electrically conductive zones of the support substrate.

Each spring has a first free region in contact with the corresponding end of the electrically conductive path or in contact with the corresponding electrically conductive zone of the support substrate, Moreover, each spring has a second region fastened onto said corresponding electrically conductive zone of the support substrate or onto said corresponding end of the electrically conductive path, respectively.

In other words, for each spring, the first free region can be in contact either with the corresponding end of the electrically conductive path and in this case the second region of the spring is fastened onto the corresponding zone of the support substrate, or in contact with the corresponding zone of the support substrate, and in this case the second region of the spring is fastened onto the corresponding end of the electrically conductive path.

Moreover, the fastening device also includes an electrically insulating auxiliary attachment, for example an insulating glue, disposed between the springs and configured to fasten onto the support substrate the part of the encapsulation hood located between the ends of said at least one conductive path.

Thus, contrary to the prior art, the package according to this aspect does not have a rigid electrically conductive connection between the electrically conductive path incorporated into the encapsulation hood and the corresponding electrically conductive zones, for example metal, of the support substrate.

On the contrary, the use of springs, advantageously compressed, having a region that is free, that is to say not fastened onto either the end of the conductive path or the metal zone of the corresponding support substrate, but simply in contact, allows to absorb the possible expansion due to the different expansion coefficients of the various components of the package and thus minimizes the risk of the appearance of defects.

The springs, advantageously compressed during the fastening of the encapsulation hood onto the support substrate, contribute, by their spring effect obtained here by compression, to ensuring good electric contact at their free region.

According to one implementation, the second region of each spring, that is to say the one that is not left free, is fastened onto said corresponding zone of the support substrate or onto said corresponding end of the electrically conductive path by an electrically conductive glue.

Moreover, the auxiliary attachment includes for example, as indicated above, an electrically insulating glue, for example a glue that can be hardened by applying ultraviolet radiation.

According to a specific implementation, the electronic chip can include a source of optical radiation, for example a source of laser radiation, and the encapsulation hood can include an optical device, for example a lens, optically coupled to said source.

According to another aspect, a method for creating a package of an integrated circuit is proposed, comprising fastening, onto a support substrate supporting at least one electronic chip, an encapsulation hood incorporating an electrically conductive path having at least two distinct ends.

According to this aspect, said fastening comprises the following steps: providing at least two electrically conductive springs each having a first region and a second region; leaving free the first region of each spring and placing it in contact with the corresponding end of the electrically conductive path or in contact with a corresponding electrically conductive zone of the support substrate; fastening the second region of each spring onto said corresponding electrically conductive zone or onto said corresponding end of the electrically conductive path, respectively, in such a way as to respectively electrically couple the two ends of the electrically conductive path to the two electrically conductive zones of the support substrate; and fastening, onto the support substrate and in an electrically insulating manner, the part of the encapsulation hood located between the ends of said at least one conductive path.

According to one embodiment, said fastening is carried out in such a way as to compress the springs.

According to one embodiment, the fastening of the second region of each spring is carried out via an electrically conductive glue.

According to one embodiment, the fastening of the part of the encapsulation hood located between the ends of said at least one conductive path is carried out via an electrically insulating glue.

As indicated above, the electronic chip can include a source of optical radiation and the encapsulation hood can include an optical device optically coupled to said source.

BRIEF DESCRIPTION OF THE DRAWINGS

Other advantages and features of the invention will appear upon examination of the detailed description of implementations and embodiments, in no way limiting, and of the appended drawings in which.

DETAILED DESCRIPTION

Figure 1:
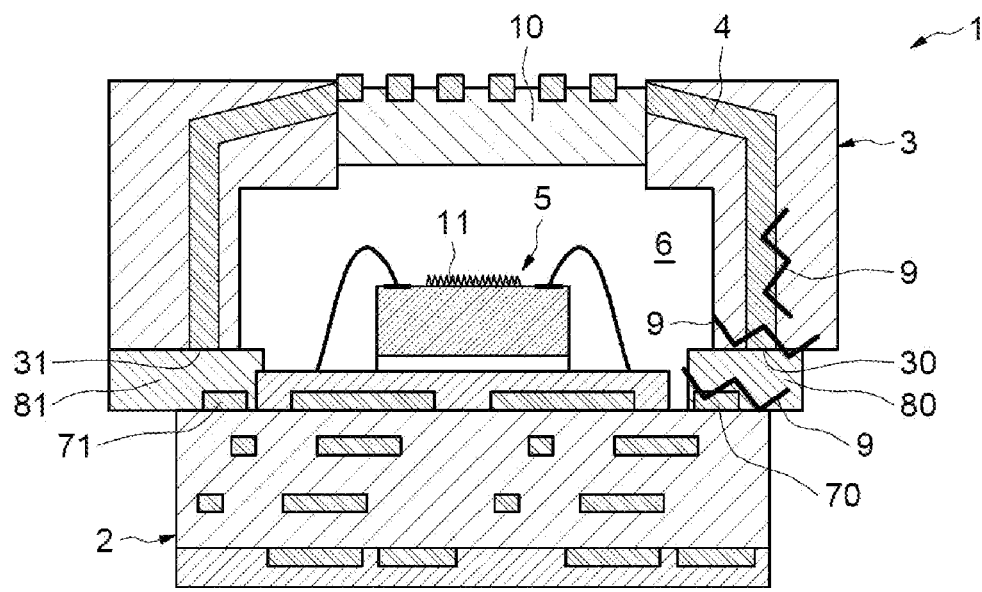
FIG. 1 illustrates a package in accordance with the prior art.
Figure 2:
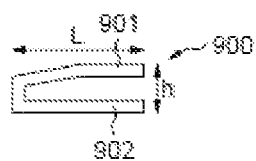
FIG. 2 illustrates a spring.

In FIG. 2, the reference 900 designates a spring, for example a microspring, usable in the fastening and the electric connection of the electrically conductive path incorporated into the encapsulation hood and the corresponding electrically conductive zone of the support substrate.

In this example, the microspring is in the shape of a U with a length L of approximately 0.1 mm to 2 mm and a distance h of approximately 0.05 mm to 0.50 mm between the first region, for example a first face or leg, 901 of the spring and the second region, for example a second face of leg, 902 of the spring.

The height h is the height when the spring is not loaded.

The material forming this spring is electrically conductive and can be, for example, made of steel, stainless steel or another metal, and provided or not with a finish (for example nickel, nickel and gold or nickel and palladium and gold).

Figure 3:
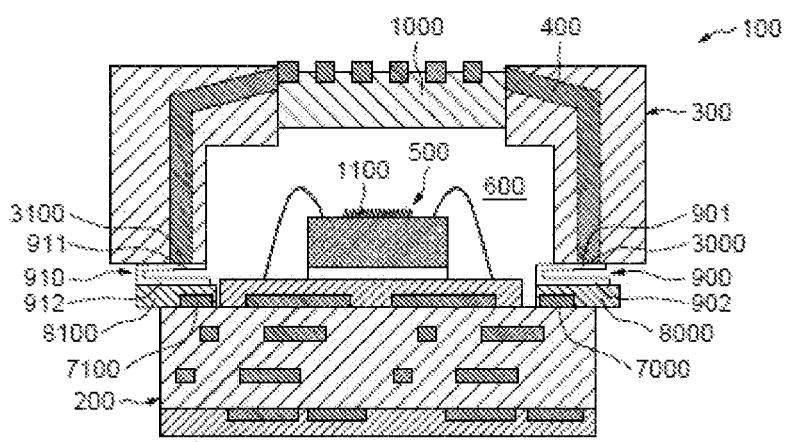
FIG. 3 schematically illustrates a cross-section of a package using the spring of FIG. 2.

FIG. 3 schematically illustrates a cross-section of a package 100 according to one implementation of the invention.

This package 100 includes a support substrate 200 including a network of interconnections embedded in the body of the support substrate and allowing in particular to electrically connect metal tracks located on the mounting face of the support substrate to for example a ball grid (in the case of a package of the BGA type) located on the opposite face of the support substrate.

The support substrate 200 supports on its mounting face an electronic chip 500 equipped in this example with a source of light radiation 1100, for example a laser source.

An encapsulation hood 300, incorporating an electrically conductive path 400, is fastened onto the mounting face of the support substrate by a fastening device, the structure of which will be described in more detail below.

Once the encapsulation hood has been assembled onto the support substrate, the assembly arranges an inner housing 600 in which the electronic chip 500 is located.

Moreover, in this example, the encapsulation hood 300 includes an optical device 1000, for example a lens, located in optical coupling with the laser source 500. For example, this lens is located facing the laser source 500.

The electrically conductive path 400 includes a distinct first end 3000 and second end 3100 located at a bottom edge of the encapsulation hood.

Moreover, the support substrate 200 includes on its mounting face a first electrically conductive zone 7000 and a second electrically conductive zone 7100.

As will now be shown, the first end 3000 of the electrically conductive path 400 is electrically coupled to the first electrically conductive zone 7000 while the second end 3100 of the electrically conductive path 400 is electrically coupled to the second electrically conductive zone 7100.

This coupling is carried out using the fastening device in the form of a spot of electrically conductive glue and a spring such as that illustrated in FIG. 2.

More precisely, the second region 902 of the spring 900 is glued onto the spot of conductive glue 8000 that covers the first electrically conductive zone 7000.

Moreover, the first region 901 of the spring 900 is not fastened, but it is free and in contact with the first end 3000 of the electrically conductive path 400.

It can be seen in this example that the spring 900 is compressed. Therefore, the contact between the first region 901 of the spring 900 and the first end 3000 of the electrically conductive path 400 is obtained by the spring effect of the spring which is stressed, here in compression.

There is the same structure for the electric coupling between the second end 3100 of the electrically conductive path 400 and the second electrically conductive zone 7100 of the support substrate.

More precisely, this electrical coupling is obtained by a spring 911, analogous to the spring 900, compressed, and having its first region 911 in contact with the second end 3100 of the path 400 by the spring effect, and having its second region 912 glued onto the spot of electrically conductive glue 8100 covering the second electrically conductive zone 7100.

Figure 7:
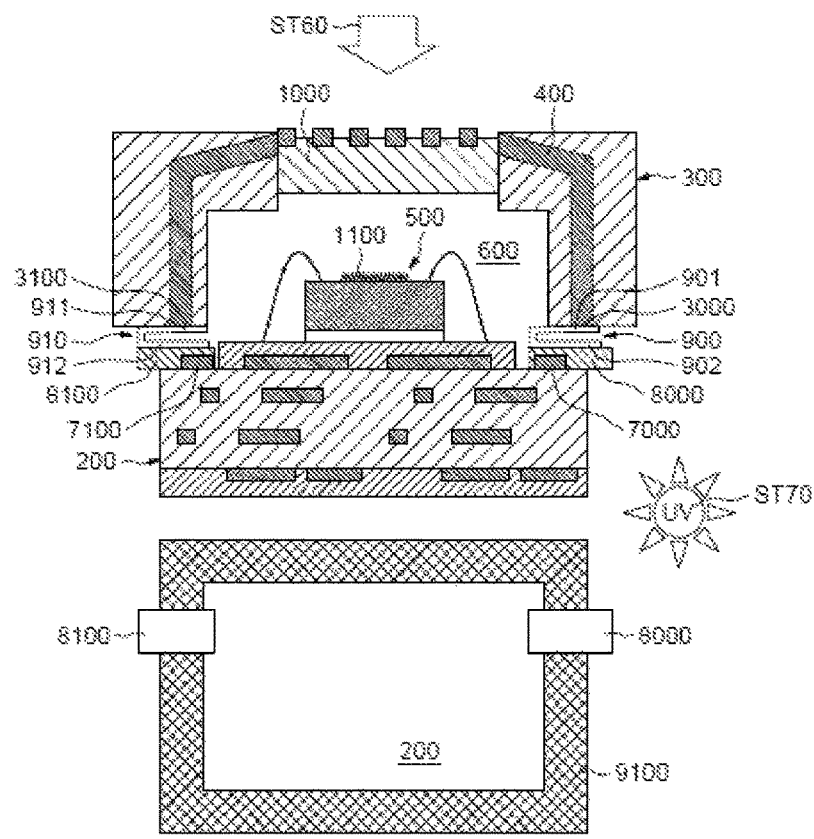

Moreover, as illustrated in FIG. 7, which will be addressed in more detail below during the disclosure of an example of a manufacturing method, it can be seen that to maintain the encapsulation hood fastened onto the support substrate, there is an auxiliary attachment, for example a bead of electrically insulating glue 9100 disposed on the periphery of the mounting face of the support substrate extending between the spots of conductive glue 8000 and 8100 and allowing to fasten, onto the support substrate, the part of the encapsulation hood located between the two springs 900 and 910.

Reference is now made more particularly to FIGS. 4 to 7 to illustrate an embodiment of a method according to the invention.

In each of FIGS. 4 to 7, the upper part of the drawing shows a schematic cross-section of the package being manufactured while the lower part of the figure schematically shows a top view of the mounting face of the support substrate 200.

Figure 4:
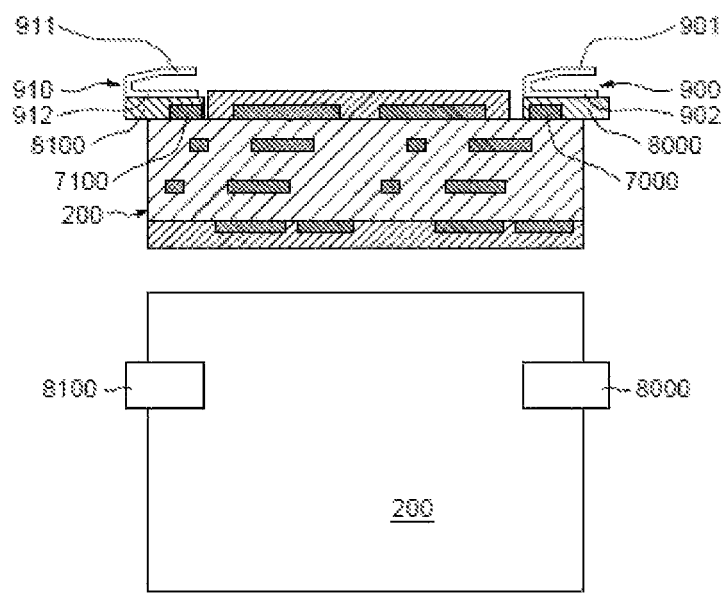
FIGS. 4 to 7 illustrate an embodiment of a method of manufacturing the package of FIG. 3.

In FIG. 4, on the periphery of the mounting face of the support substrate 200, two spots of electrically conductive glue 8000 and 8100 covering the two electrically conductive zones 7000 and 7100 of the support substrate are deposited, and the second regions 902 and 912 of the two springs 900 and 910 are fastened onto these two spots of glue 8000 and 8100, respectively.

The first regions 901 and 911 of these springs remain free. Moreover, in this configuration, the springs are not stressed.

Any type of glue can be used that is electrically conductive, conventional and well known to a person skilled in the art.

Figure 5:
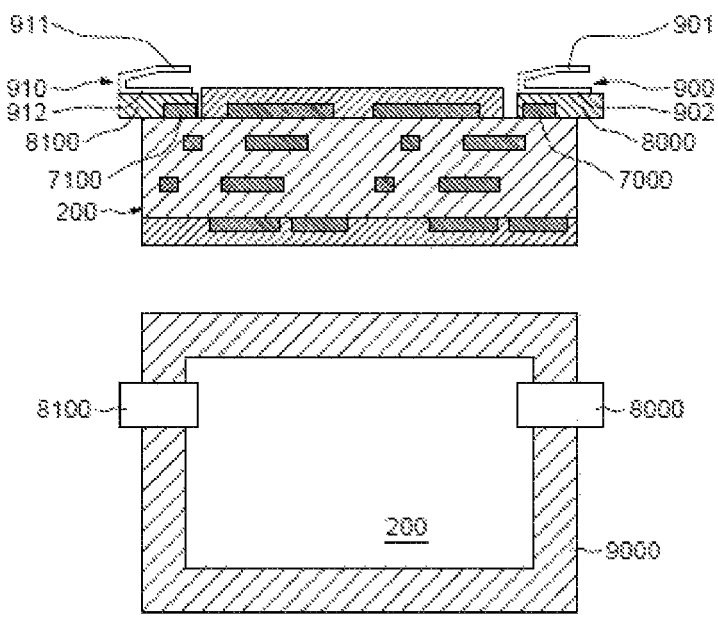

Then, as illustrated in FIG. 5, a bead of electrically insulating glue 9000 is deposited on the mounting face of the substrate 200 between the two spots of electrically conductive glue 8000 and 8100.

This non-insulating glue can be, for example, a glue that is hardenable via UV radiation, conventional and well known to a person skilled in the art.

Figure 6:
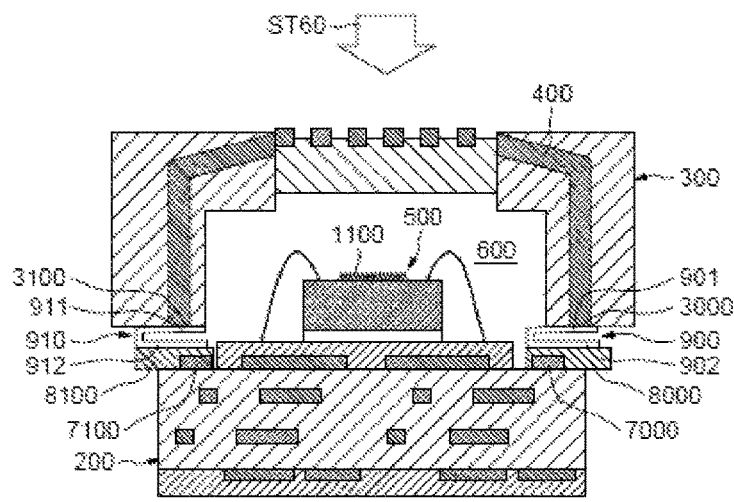

Then, as illustrated in FIG. 6, after having mounted the chip on the support substrate and carrying out its connection by welding of wires (wire bonding) and after having created in a conventional and known manner the encapsulation hood incorporating the electrically conductive path and the optical device 1000, on the one hand the encapsulation hood is applied onto the free regions 901 and 911 of the springs 900 and 910 and, on the other hand, the part of the encapsulation hood located between the two springs is applied onto the bead of insulating glue 9000, by exerting a force ST60.

By the application of this force ST60, the two springs 900 and 910 are compressed and their first respective free regions 901 and 911 are in contact with the corresponding ends 3000 and 3100 of the electrically conductive path 400, and the encapsulation hood adheres to the support substrate via the bead of insulating glue 9000.

Then, while maintaining the compression force ST60, as illustrated in FIG. 7, exposure of the package of FIG. 6 to ultraviolet radiation ST70 is carried out in such a way as to harden the bead of insulating glue and obtain in fine a bead of insulating hardened glue 9100.

The invention is not limited to the implementations and embodiments that have just been described and encompasses all the alternatives thereof.

Thus, the spots of electrically conductive glue 8000 and 8100 can be replaced by solder pads or by any other electric connection means.

Likewise, it would be possible to fasten the regions 901 and 911 of the springs onto the two ends 3000 and 3100 of the electrically conductive path 400 and leave free the regions 902 and 912 of these springs in order for them to come in contact with the two electrically conductive zones 7000 and 7100 of the support substrate.

In this case the regions 902 and 912 would be considered to be the first free regions of these springs and the regions 901 and 911 would be considered to be the second fastened regions.

Finally, it would be possible to provide, instead of a single electrically conductive path 400, a network of electrically conductive paths incorporated into the encapsulation hood with a corresponding set of pairs of spots of conductive glue for example.

The invention claimed is:

1. A package for an integrated circuit, comprising:
    a support substrate including first and second conductive zones at a top surface;
    at least one electronic chip mounted to the top surface of the support substrate;
    an encapsulation hood fastened directly onto the top surface of the support substrate by a fastening device, wherein the encapsulation hood incorporates an electrically conductive path having at least two distinct ends;
    wherein the fastening device comprises:
        at least two springs respectively electrically coupling the two ends of the electrically conductive path at the encapsulation hood to the first and second electrically conductive zones at the top surface of the support substrate, each spring having as a first free region in contact with one of said at least two distinct ends of the electrically conductive path at the encapsulation hood or one of said first and second electrically conductive zones and a second region fastened onto another of said first and second electrically conductive zone or another of said at least two distinct ends of the electrically conductive path at the encapsulation hood, respectively; and
        an electrically insulating auxiliary attachment disposed between the springs and configured to fasten a part of the encapsulation hood located between the ends of said at least one conductive path onto the top surface of the support substrate.

2. The package according to claim 1, wherein each spring is compressed.

3. The package according to claim 1, wherein the second region of each spring is fastened by an electrically conductive glue.

4. The package according to claim 1, wherein the electrically insulating auxiliary attachment includes an electrically insulating glue.

5. The package according to claim 1, wherein the electronic chip includes a source of optical radiation, and wherein the encapsulation hood includes an optical device optically coupled to said source of optical radiation.

6. A method for creating a package for an integrated circuit, comprising:
  fastening an encapsulation hood incorporating an electrically conductive path having at least two distinct ends directly onto a top surface of a support substrate including two electrically conductive zones;
  mounting at least one electronic chip to the top surface of the support substrate;
  wherein fastening comprises:
    providing at least two electrically conductive springs, wherein each electrically conductive spring has a first region and a second region;
    leaving free the first region of each electrically conductive spring and placing it in contact with one of the two distinct ends of the electrically conductive path at the encapsulation hood or one of the two electrically conductive zones at the top surface of the support substrate;
    fastening the second region of each electrically conductive spring onto another of said two electrically conductive zones at the top surface of the support substrate or onto another of the two distinct ends of the electrically conductive path at the encapsulation hood, respectively, in such a way as to respectively electrically couple the two ends of the electrically conductive path at the encapsulation hood to the two electrically conductive zones at the top surface of the support substrate; and
    securing part of the encapsulation hood located between the ends of said at least one conductive path onto the top surface of the support substrate in an electrically insulating manner.

7. The method according to claim 6, wherein said fastening comprises compressing said at least two electrically conductive springs.

8. The method according to claim 6, wherein fastening of the second region of each electrically conductive spring comprises using an electrically conductive glue.

9. The method according to claim 6, wherein securing comprises using an electrically insulating glue.

10. The method according to claim 6, wherein the electronic chip includes a source of optical radiation and the encapsulation hood includes an optical device optically coupled to said source.

11. A package for an integrated circuit, comprising:
  a support substrate having a top surface;
  at least one electronic chip mounted to the top surface;
  an electrically conductive zone at the top surface of the support substrate;
  a spring having a first end fastened to the electrically conductive zone and having a free second end;
  an encapsulation hood including an electrically conductive path having an end;
  wherein the encapsulation hood is fastened directly onto top surface of the support substrate by an insulating adhesive in a position where the end of the electrically conductive path at the encapsulation hood is in contact with the free second end of the spring and the fastening of the encapsulation hood compresses the spring.

12. The package according to claim 11, wherein the first end of the spring is fastened to the electrically conductive zone by an electrically conductive glue.

13. The package according to claim 11, wherein the at least one electronic chip includes a source of optical radiation, and wherein the encapsulation hood includes an optical device optically coupled to said source of optical radiation.

* * * * *